(12) United States Patent
Tabery et al.

(10) Patent No.: US 7,915,160 B1
(45) Date of Patent: Mar. 29, 2011

(54) METHODS FOR FORMING SMALL CONTACTS

(75) Inventors: Cyrus E. Tabery, Santa Clara, CA (US);
Srikanteswara Dakshina-Murthy, Wappingers Falls, NY (US); Chih-Yuh Yang, San Jose, CA (US); Bin Yu, Cupertino, CA (US)

(73) Assignee: GlobalFoundries Inc., Grand Cayman (KY)

( * ) Notice: Subject to any disclaimer, the term of this patent is extended or adjusted under 35 U.S.C. 154(b) by 620 days.

(21) Appl. No.: 11/625,190

(22) Filed: Jan. 19, 2007

Related U.S. Application Data

(62) Division of application No. 10/728,909, filed on Dec. 8, 2003, now Pat. No. 7,183,223.

(51) Int. Cl.
*H01L 21/4763* (2006.01)
*H01L 21/302* (2006.01)

(52) U.S. Cl. ........ 438/631; 438/623; 438/624; 438/628; 438/706; 438/723; 257/632; 257/750; 257/758; 257/760; 257/E21.035; 257/E21.038; 257/E21.252; 257/E21.257; 257/E21.579

(58) Field of Classification Search .................. 438/623, 438/624, 628, 706, 723; 257/632, 750, 758, 257/760, E21.035, E21.038, E21.252, E21.257, 257/E21.579
See application file for complete search history.

(56) References Cited

U.S. PATENT DOCUMENTS

| 5,994,216 | A | 11/1999 | Cheng | |
|---|---|---|---|---|
| 6,645,797 | B1 * | 11/2003 | Buynoski et al. | 438/157 |
| 6,864,164 | B1 * | 3/2005 | Dakshina-Murthy et al. | 438/585 |
| 6,878,619 | B2 * | 4/2005 | Kakamu | 438/631 |
| 6,939,794 | B2 * | 9/2005 | Yin et al. | 438/624 |
| 2005/0059249 | A1 | 3/2005 | Hsieh | |

FOREIGN PATENT DOCUMENTS

JP    08-236475    9/1996

OTHER PUBLICATIONS

A Definition of the term interlevel dielectric from the Semicyclopedia on the STOL (i.e.-Semiconductor Technology Online) Website; web address of http://semitechonline.com/semicyclopedia.htm.
Digh Hisamoto et al., "FinFEAT-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 199 IEEE, IEDM, pp. 67-70.
Yang-Kyu Choi et al., "Nanoscale CMOS Spacer FinFET for the Terabit ERA," IEEE Electron Device Letters, vol. 23, No. 1, Jan. 2002, pp. 25-27.

* cited by examiner

*Primary Examiner* — Dao H Nguyen
(74) *Attorney, Agent, or Firm* — Harrity & Harrity, LLP

(57) ABSTRACT

Methods are provided for forming contacts for a semiconductor device. The methods may include depositing various materials, such as polysilicon, nitride, oxide, and/or carbon materials, over the semiconductor device. The methods may also include forming a contact hole and filling the contact hole to form the contact for the semiconductor device.

10 Claims, 31 Drawing Sheets

METHODS FOR FORMING SMALL CONTACTS

RELATED APPLICATIONS

This application is a divisional application of U.S. patent application Ser. No. 10/728,909 filed Dec. 8, 2003, the entire disclosure of which is incorporated herein by reference.

FIELD OF THE INVENTION

The present invention relates generally to semiconductor devices and, more particularly, to methods for forming small contacts for metal-oxide semiconductor field-effect transistor (MOSFET) devices.

BACKGROUND OF THE INVENTION

Scaling of device dimensions has been a primary factor driving improvements in integrated circuit performance and reduction in integrated circuit cost. Due to limitations associated with gate-oxide thicknesses and source/drain (S/D) junction depths, scaling of existing bulk MOSFET devices below the 0.1 µm process generation may be difficult, if not impossible. New device structures and new materials, thus, are likely to be needed to improve MOSFET performance.

One factor that limits the size of MOSFET devices is the size of the contacts. For example, transistors typically have several contact holes associated with the source, drain, and gate. The size of the contact holes partially determines the size of the transistors. This also holds true for Static Random Access Memory (SRAM) cells and flash memory cells. In fact, the contact size affects the cell size of almost every semiconductor technology. By shrinking the contacts, the size of the MOSFET devices may be reduced.

Another factor that affects the size of MOSFET devices is contact pitch (i.e., the spacing between contacts). The contact pitch is usually limited by lithography.

Existing processes for forming contacts include lithography techniques, where contact openings are printed in a photoresist, followed by an etch process to transfer the opening to the contact level. It is usually difficult to print small contacts by lithography (i.e., using small holes in the reticle and low exposure energy) since this leads to a small and usually unmanufacturable lithography process window in terms of exposure and process latitude. It is, therefore, advantageous to be able to print the actual contact hole at a larger size lithographically, but use an appropriate shrink technique in order to reduce the dimension of the eventual contact. Other techniques include a spacer-based contact shrinking technique and a Resolution Enhancement of Lithography by Assist of Chemical Shrinkage (RELACS) technique. The formation of small contacts (e.g., less than 100-140 nm), however, is difficult to achieve using existing techniques.

SUMMARY OF THE INVENTION

Implementations consistent with the principles of the invention provide methods for forming small contacts (e.g., contacts less than approximately 100-140 nm) using an image reversal technique.

In one aspect consistent with the principles of the invention, a method for forming a contact for a semiconductor device is provided. The method may include forming an interlayer dielectric on the semiconductor device; depositing a nitride layer over the interlayer dielectric; polishing the nitride layer to expose a portion of the interlayer dielectric; forming a contact hole through the exposed portion of the interlayer dielectric; and filling the contact hole to form the contact for the semiconductor device.

In yet another aspect, a method for forming a contact for a semiconductor device is provided. The method may include depositing a first polysilicon material over the semiconductor device; depositing an oxide material on the first polysilicon material; etching the oxide material to leave a portion of the oxide material; removing the portion of the oxide material; forming a contact hole through the first polysilicon material at a location of the removed portion of the oxide material; and filling the contact hole to form the contact for the semiconductor device.

In a further aspect, a method for forming a contact for a semiconductor device is provided. The method may include depositing a carbon material over the semiconductor device; etching the carbon material to leave a portion of the carbon material; depositing a nitride material; forming a contact hole by removing the portion of the carbon material; and filling the contact hole to form the contact for the semiconductor device.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide methods for forming small contacts (e.g., contacts less than approximately 100 nm) using, for example, an image reversal technique. Such small contacts permit the size of semiconductor devices, such as flash memory devices, SRAM devices, and transistors, to be reduced.

Figure 1:
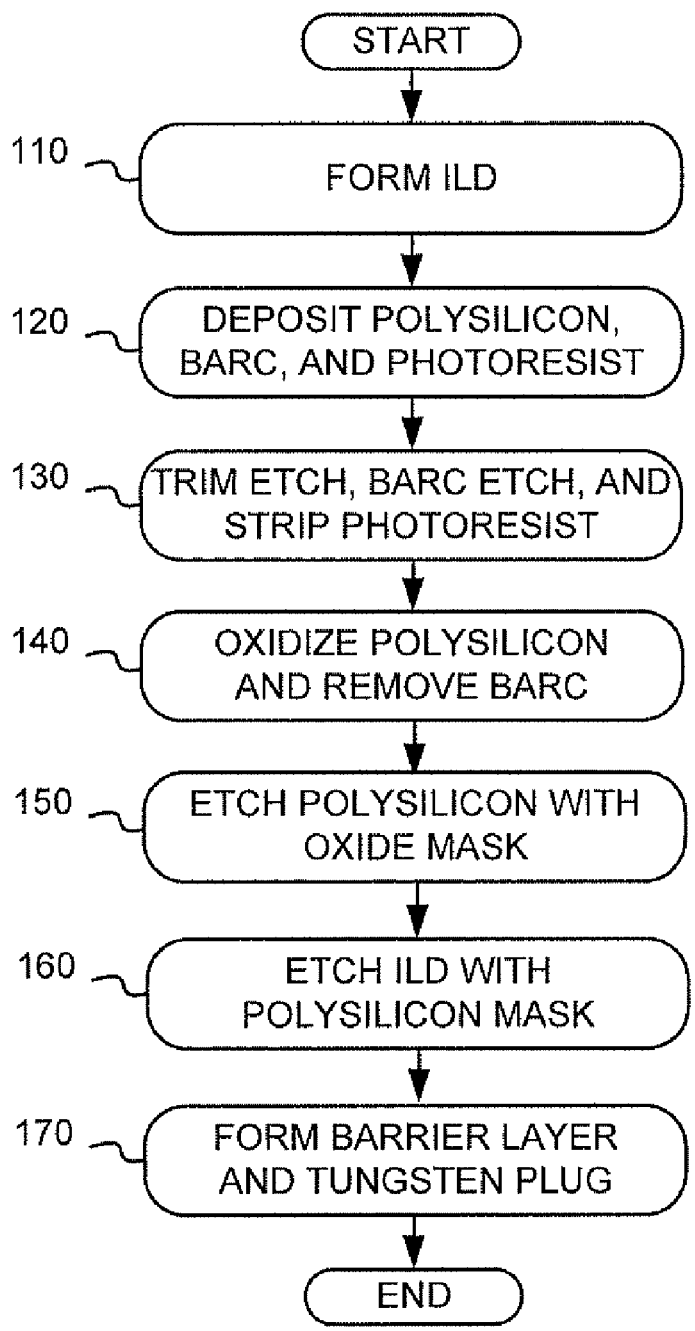
FIG. 1 illustrates an exemplary process for forming small contacts on a semiconductor device in an implementation consistent with the principles of the invention.

FIG. 1 illustrates an exemplary process for forming small contacts on a semiconductor device in an implementation consistent with the principles of the invention. FIGS. 2-6 illustrate exemplary cross-sectional views of a semiconductor device fabricated according to the processing described with regard to FIG. 1.

Figure 2:
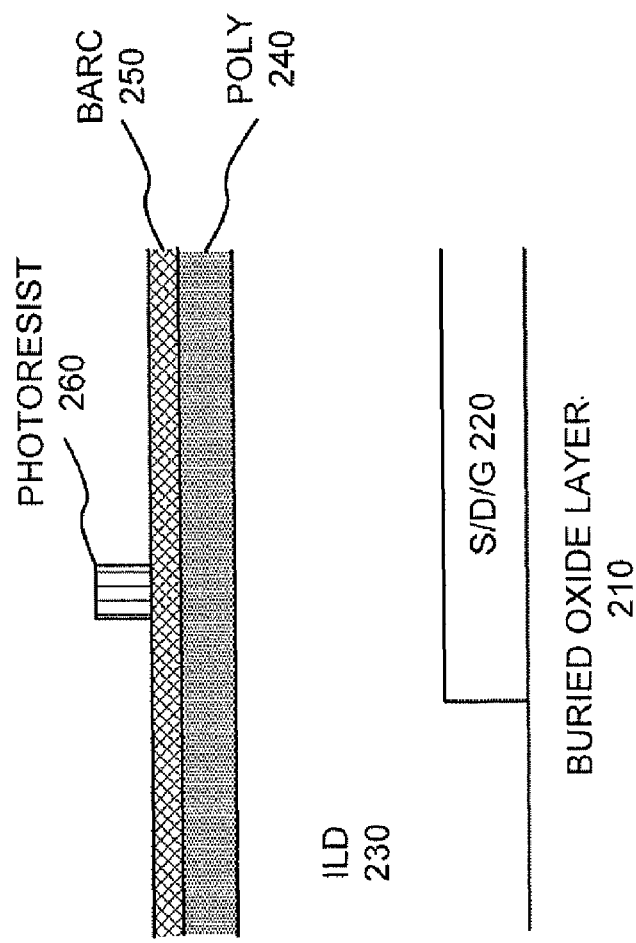
FIGS. 2-6 illustrate exemplary cross-sectional views of a semiconductor device fabricated according to the processing described with respect to FIG. 1.

With reference to FIGS. 1 and 2, processing may begin with semiconductor device 200. Semiconductor device 200 may include a buried oxide layer 210 and a source, drain, and/or gate (S/D/G) 220 formed on buried oxide layer 210. S/D/G 220 may be formed on buried oxide layer 210 using any conventional technique. While element 220 is shown to be a source, drain, and/or gate, element 220 may be any material (e.g., any active material) that is to be contacted.

As illustrated in FIG. 2, an interlayer (or interlevel) dielectric (ILD) 230 may be formed on semiconductor device 200 (act 110). An oxide (e.g., $SiO_2$) or a nitride (e.g., $Si_3N_4$), or another type of dielectric material, may be used as ILD 230. The dielectric material may be deposited to a thickness of approximately 2000 Å to 4000 Å to cover S/D/G 220, or at least the portion of S/D/G 220 to be contacted. ILD 230 may then be polished using, for example, a conventional polishing technique, such as chemical-mechanical polishing (CMP).

A polysilicon material (poly) 240 may then be deposited on ILD 230 (act 120), as illustrated in FIG. 2. Polysilicon material 240 may include a polysilicon or an amorphous silicon material, or some other type of silicon-based material. Polysilicon material 240 may be deposited to a thickness ranging from about 500 Å to 1000 Å.

A bottom antireflective coating (BARC) layer 250 may be formed on polysilicon 240 (act 120), as illustrated in FIG. 2. For example, a silicon-rich nitride (SiRN) material, or another type of material (e.g., another type of nitride), may be applied to polysilicon 240 using a conventional technique, such as a spin-on or chemical vapor deposition (CVD) technique. BARC layer 250 may be formed to a thickness of approximately 200 Å to 350 Å on polysilicon material 240.

A photoresist 260, or the like, may be deposited and patterned to facilitate formation of the contacts (act 120), as shown in FIG. 2. Photoresist 260 may include any conventional photoresist material and may be deposited on BARC 250 to a thickness ranging from about 2000 Å to 4000 Å. The width of photoresist 260, as shown in FIG. 2, may range from about 2000 Å to 2500 Å.

Figure 3:
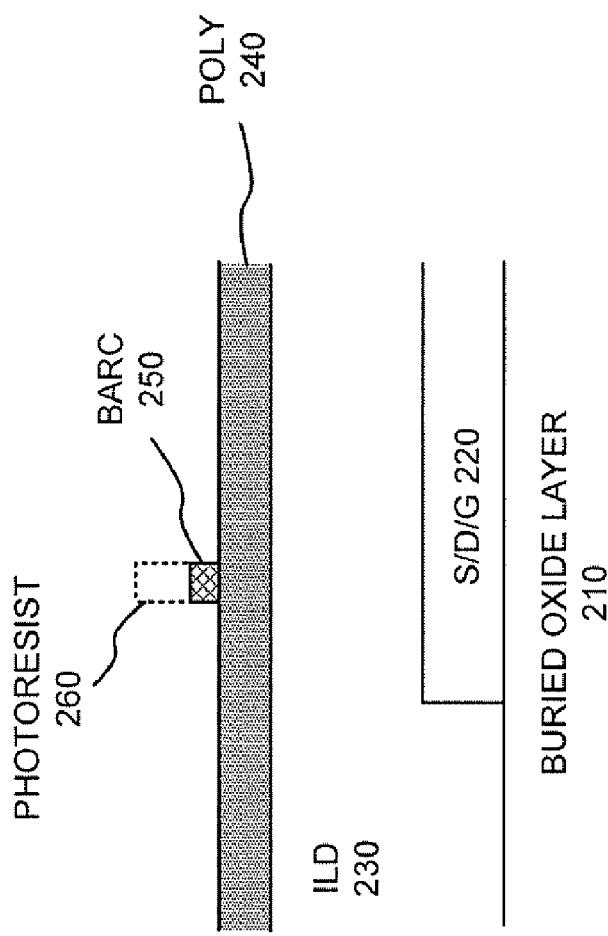

Photoresist 260 may then be trim etched, using a conventional technique, to narrow the width of photoresist 260 (act 130), as illustrated in FIG. 3. The width of photoresist 260 after the trim etch may range from about 1000 Å to 1400 Å.

As illustrated in FIG. 3, BARC 250 may be etched using any conventional technique (act 130). For example, BARC 250 may be etched to remove BARC 250 from over polysilicon 240, except that portion of BARC 250 under photoresist 260, as illustrated in FIG. 3. The remaining width of BARC 250 after the etch may range from about 1000 Å to 1400 Å. Photoresist 260 may then be stripped using any conventional technique (act 130).

Figure 4:
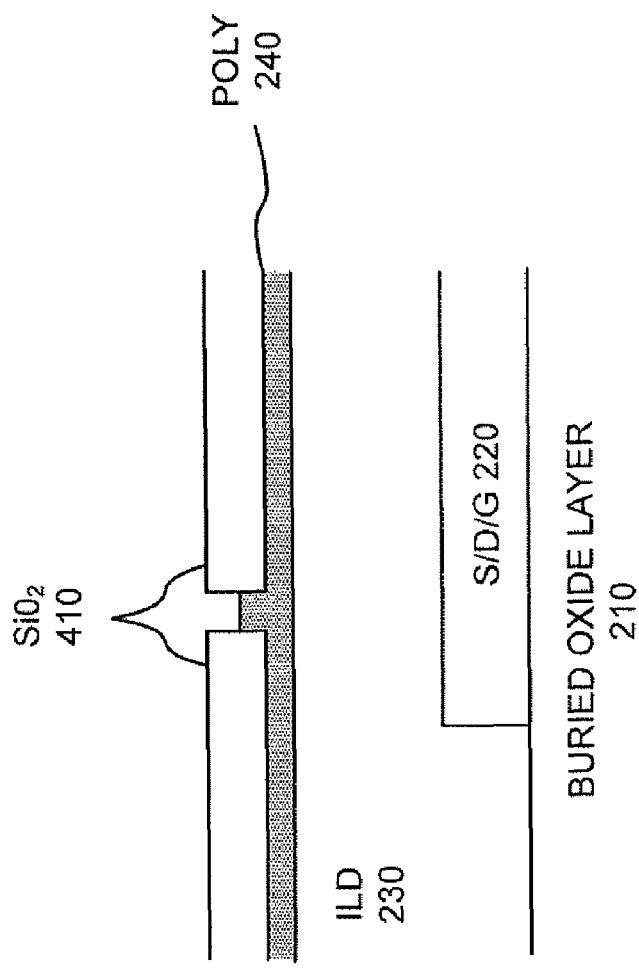

A thermal oxidation process may be performed to oxidize the exposed portions of polysilicon 240 (act 140). As illustrated in FIG. 4, a layer of silicon dioxide ($SiO_2$) 410 may be formed on polysilicon 240 as a result of the thermal oxidation. Silicon dioxide 410 may penetrate into polysilicon 240 as a result of the thermal oxidation. The thickness of silicon dioxide layer 410 may range from approximately 150 Å to 300 Å. BARC 250 may then be removed using a conventional technique (act 140), such as using hot phosphoric acid.

Figure 5:
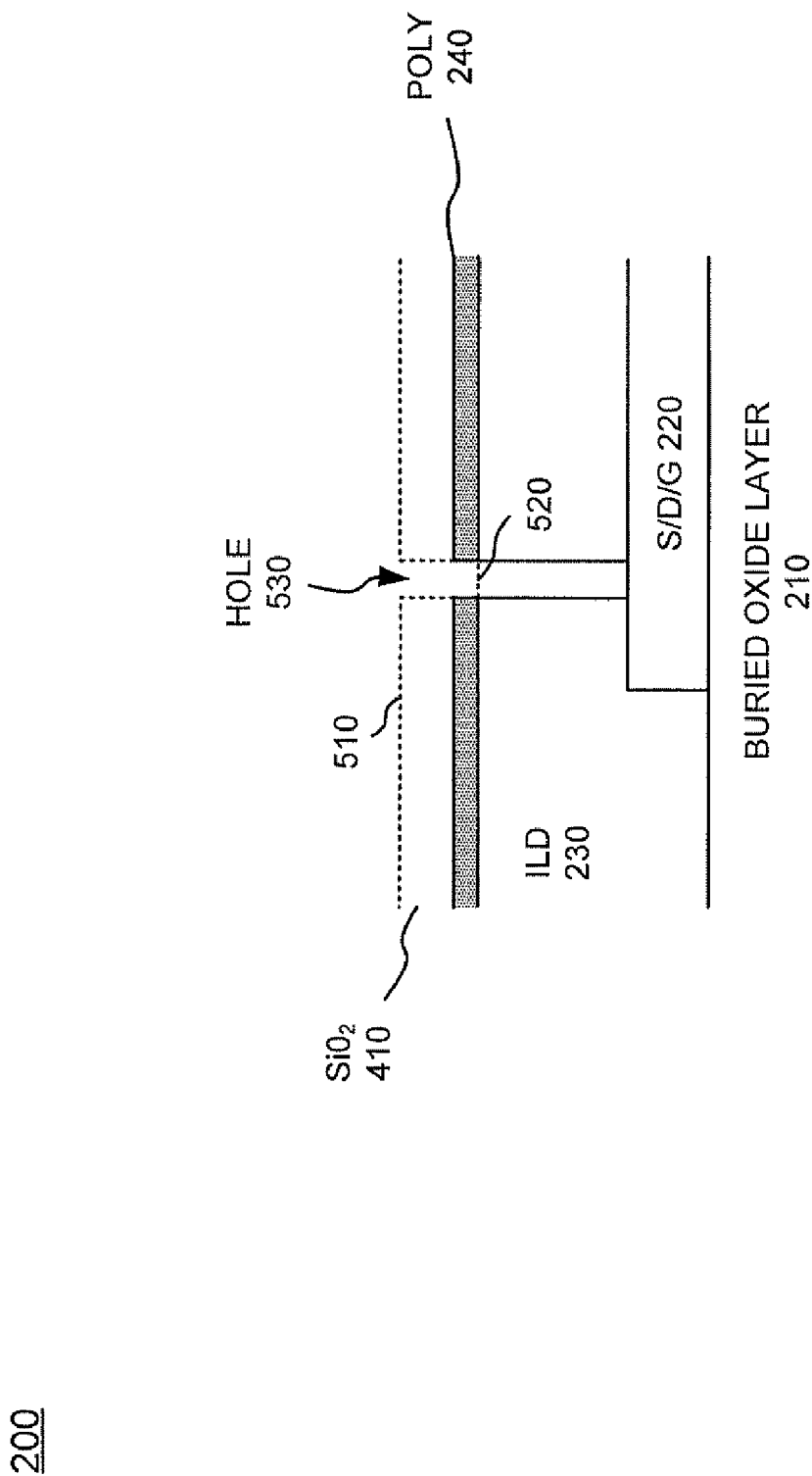

Polysilicon 240 may be etched using silicon dioxide 410 as a mask (act 150). Excellent selectivity may be achieved in this etching process by using plasma chemistries, such as $HBr/O_2$, resulting in minimal loss of silicon dioxide 410. As illustrated in FIG. 5 by dotted lines 510 and 520, the etching of polysilicon 240 may cause the removal of some of silicon dioxide 410 and may terminate at ILD 230. ILD 230 may then be etched using polysilicon 240 as a mask (act 160). Excellent selectivity of oxide to silicon can be attained by using chemistries, such as $CHF_3/CF_4/Ar$ or $C_4F_8/O_2/Ar$, which essentially do not attack polysilicon, but etch oxide at a fast rate. As illustrated in FIG. 5, the etching of ILD 230 may form a contact hole 530 that extends to S/D/G 220. The width of contact hole 530, as illustrated in FIG. 6, may range from about 1000 Å to 1400 Å.

Figure 6:
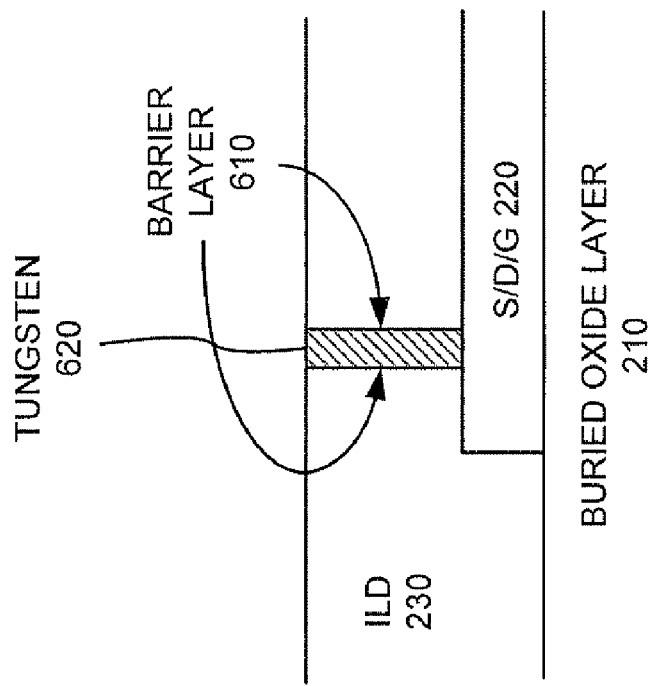

As illustrated in FIG. 6, a barrier layer 610 may then be formed on side surfaces of hole 530 (act 170). A metal (e.g., titanium nitride), or another type of conductive material (e.g., tantalum nitride), may be used as barrier layer 610. Barrier layer 610 may be deposited or otherwise formed on the side surfaces of hole 530 to a thickness ranging from about 100 Å to 200 Å.

As illustrated in FIG. 6, a tungsten plug 620 may then be formed within hole 530 (act 170). For example, a tungsten material, or another suitable contact material, such as copper or aluminum, may be deposited to fill hole 530. A polishing process, such as CMP, may then be performed to planarize semiconductor device 200. For example, the polishing process may serve to remove any remaining polysilicon 240 from over ILD 230.

The resulting semiconductor device 200 may include one or more small contacts (e.g., contacts having a size smaller than about 100-140 nm). While the above description details a process for forming a single contact, one skilled in the art would recognize that the process can be extended to form more than one contact to any material to be contacted.

Figure 7:
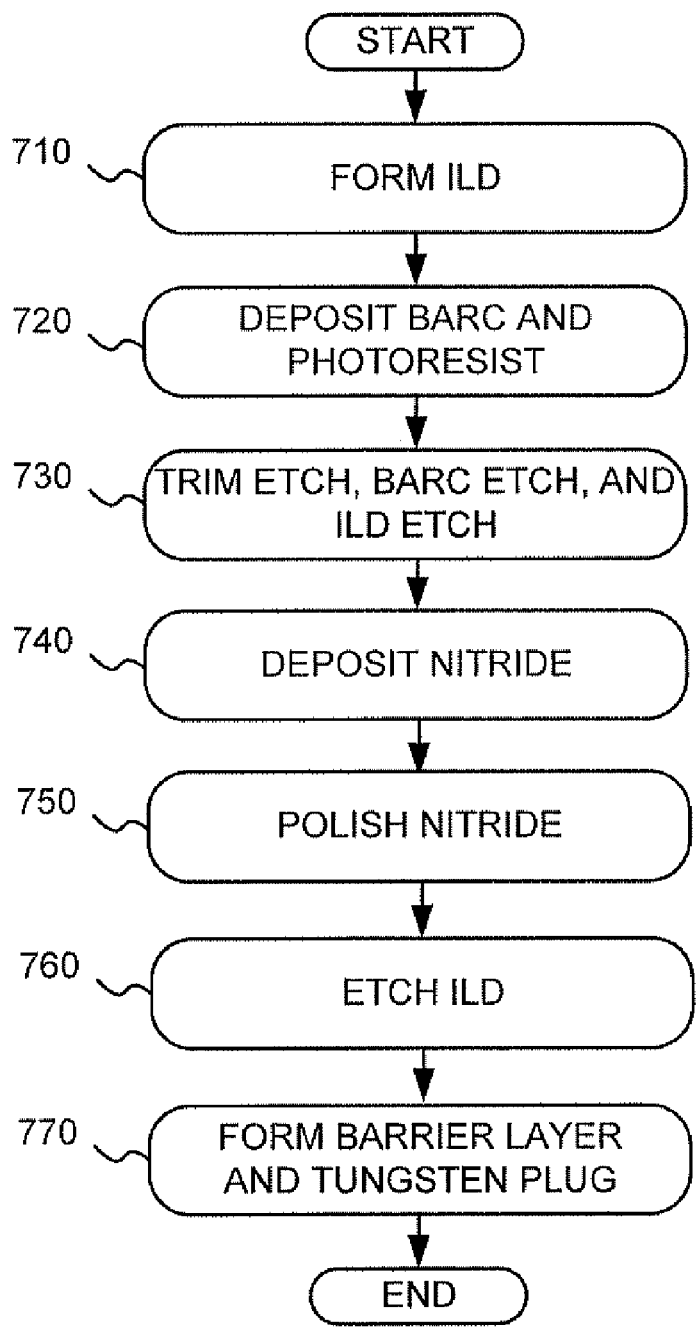
FIG. 7 illustrates an exemplary process for forming small contacts on a semiconductor device in another implementation consistent with the principles of the invention.

FIG. 7 illustrates an exemplary process for forming small contacts on a semiconductor device in another implementation consistent with the principles of the invention. FIGS. 8-13 illustrate exemplary cross-sectional views of a semiconductor device fabricated according to the processing described with regard to FIG. 7.

Figure 8:
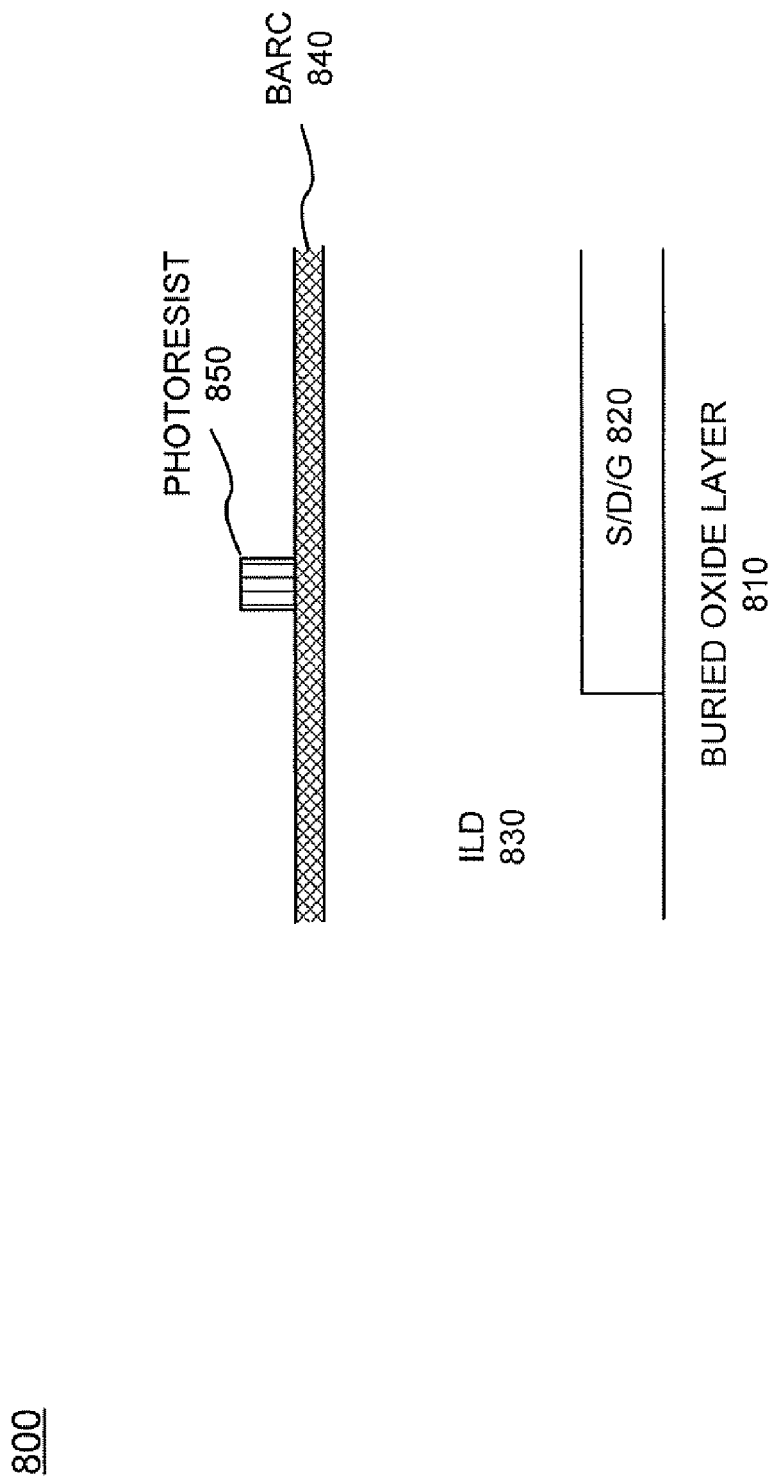
FIGS. 8-13 illustrate exemplary cross-sectional views of a semiconductor device fabricated according to the processing described with respect to FIG. 7.

With reference to FIGS. 7 and 8, processing may begin with semiconductor device 800. Semiconductor device 800 may include a buried oxide layer 810 and a source, drain, and/or gate (S/D/G) 820 formed on buried oxide layer 810. S/D/G 820 may be formed on buried oxide layer 810 using any conventional technique. While element 820 is shown to be a source, drain, and/or gate, element 820 may be any material (e.g., any active material) that is to be contacted.

As illustrated in FIG. 8, an interlayer (or interlevel) dielectric (ILD) 830 may be formed on semiconductor device 800 (act 710). An oxide (e.g., $SiO_2$) or a nitride (e.g., $Si_3N_4$), or another type of dielectric material, may be used as ILD 830. The dielectric material may be deposited to a thickness of approximately 2000 Å to 4000 Å to cover S/D/G 820, or at least the portion of S/D/G 820 to be contacted. ILD 830 may then be polished using, for example, a conventional polishing technique, such as CMP.

A BARC layer 840 may be formed on ILD 830 (act 720), as illustrated in FIG. 8. For example, a silicon-rich nitride (SiRN) material, or another type of material (e.g., another type of nitride), may be applied to ILD 830 using a conventional technique, such as a spin-on or CVD technique. BARC layer 840 may be formed to a thickness of approximately 200 Å to 350 Å on ILD 830.

A photoresist 850, or the like, may be deposited and patterned to facilitate formation of the contacts (act 720), as shown in FIG. 8. Photoresist 850 may include any conventional photoresist material and may be deposited on BARC 840 to a thickness ranging from about 2000 Å to 4000 Å. The width of photoresist 850, as shown in FIG. 8, may range from about 2000 Å to 2500 Å.

Figure 9:
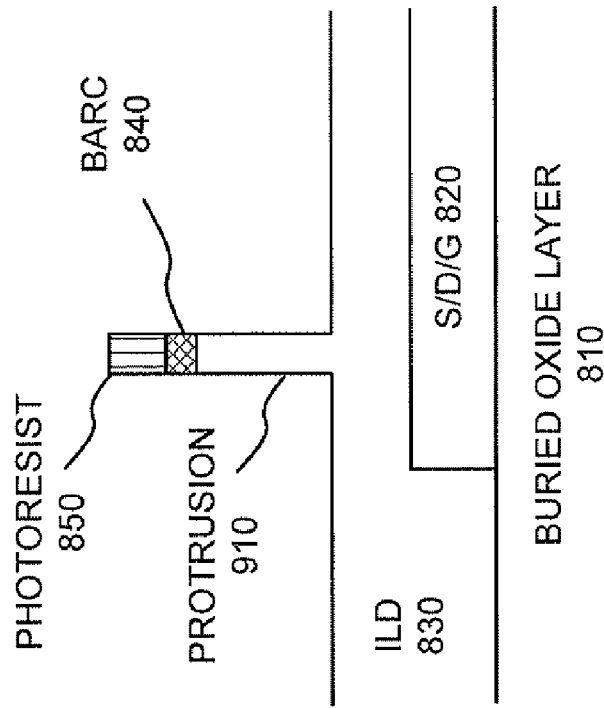

Photoresist 850 may then be trim etched, using a conventional technique, to narrow the width of photoresist 850 (act 730), as illustrated in FIG. 9. The width of photoresist 850 after the trim etch may range from about 1000 Å to 1400 Å. As illustrated in FIG. 9, BARC 840 and ILD 830 may be etched, using any conventional technique, to form a protrusion 910 beneath photoresist 850 (act 730), as illustrated in FIG. 9. The width of protrusion 910 after the etching may range from about 1000 Å to 1400 Å. The depth of protrusion 910 may range from about 400 Å to 800 Å. Photoresist 850 may then be ashed using conventional techniques.

Figure 10:
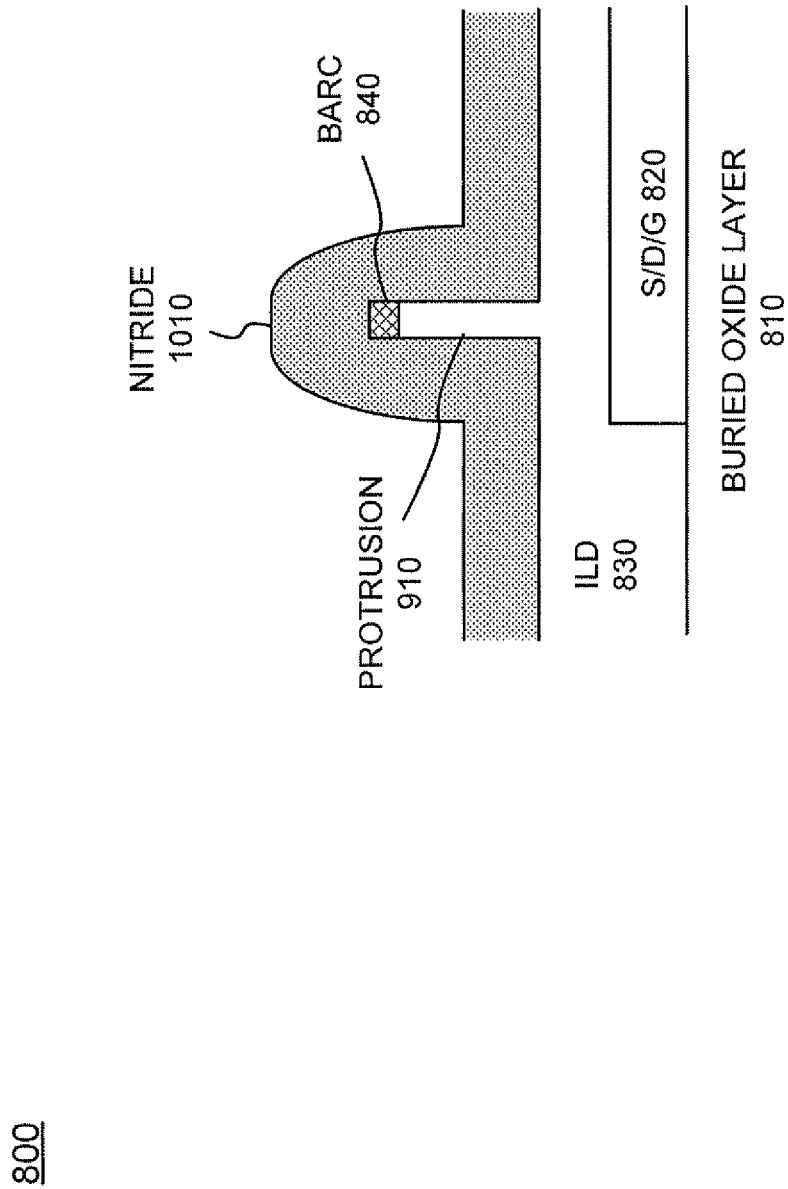

As illustrated in FIG. 10, a layer of material, such as a nitride material 1010, may be formed on ILD 830 (act 740). Nitride layer 1010 may be formed using, for example, conventional deposition techniques and may surround protrusion 910 and BARC 840. The thickness of nitride layer 1010 may range from about 600 Å to 1000 Å.

Figure 11:
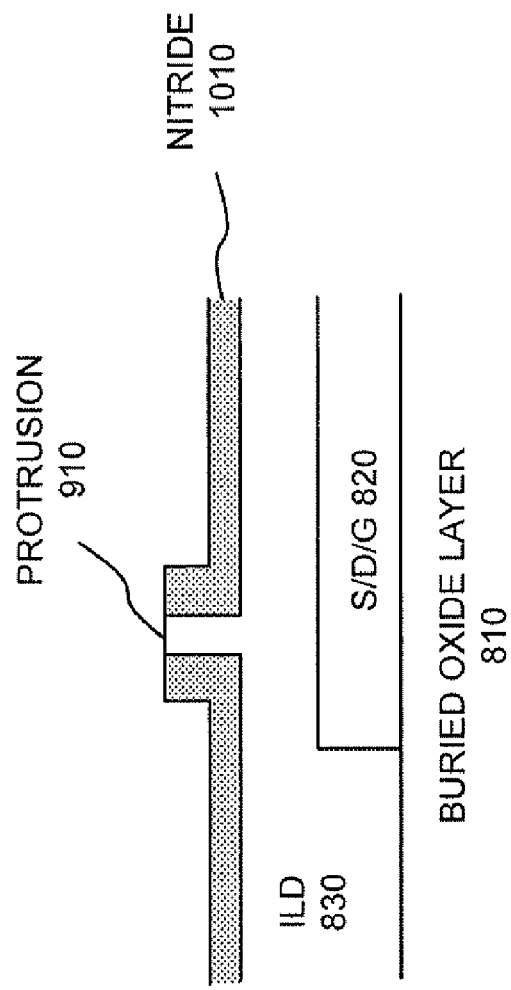

A portion of protrusion 910 and nitride layer 1010 may be polished (act 750), as illustrated in FIG. 11. For example, a "buff" type nitride polishing technique may be used to planarize nitride layer 1010 and protrusion 910. As shown in FIG. 11, the polishing may serve to remove BARC 840. After polishing, protrusion 910 may extend about 400 Å to 600 Å above ILD 830 in the vertical direction of FIG. 11.

Figure 12:
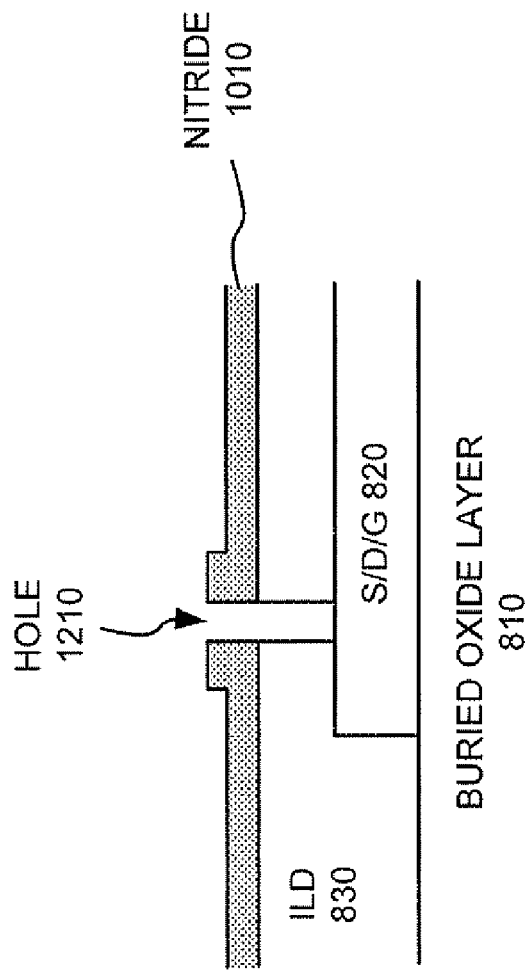

The ILD material in protrusion 910 may then be etched using, for example, nitride layer 1010 as a mask (act 760). Chemistries selective to nitride, such as $C_4F_8$/CO/Ar or $CHF_3$/Ar, may be used for the etching. As illustrated in FIG. 12, the etching of protrusion 910 may form a contact hole 1210 that extends through ILD 830 to S/D/G 820. The width of contact hole 1210, as illustrated in FIG. 12, may range from about 1000 Å to 1400 Å.

Figure 13:
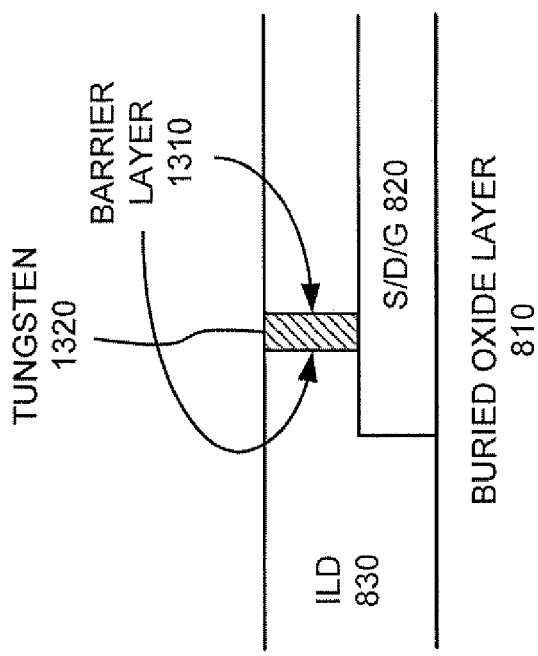

As illustrated in FIG. 13, a barrier layer 1310 may then be formed on side surfaces of hole 1210 (act 770). A metal (e.g., titanium nitride), or another type of conductive material (e.g., tantalum nitride), may be used as barrier layer 1310. Barrier layer 1310 may be deposited or otherwise formed on the side surfaces of hole 1210 to a thickness ranging from about 100 Å to 200 Å.

As illustrated in FIG. 13, a tungsten plug 1320 may then be formed within hole 1210 (act 770). For example, a tungsten material, or another suitable contact material, such as copper or aluminum, may be deposited to fill hole 1210. A polishing process, such as CMP, may then be performed to planarize semiconductor device 800. For example, the polishing process may serve to remove any remaining nitride layer 1010 from over ILD 830.

The resulting semiconductor device 800 may include one or more small contacts (e.g., contacts having a size smaller than about 100-140 nm). While the above description details a process for forming a single contact, one skilled in the art would recognize that the process can be extended to form more than one contact to any material to be contacted.

Figure 14:
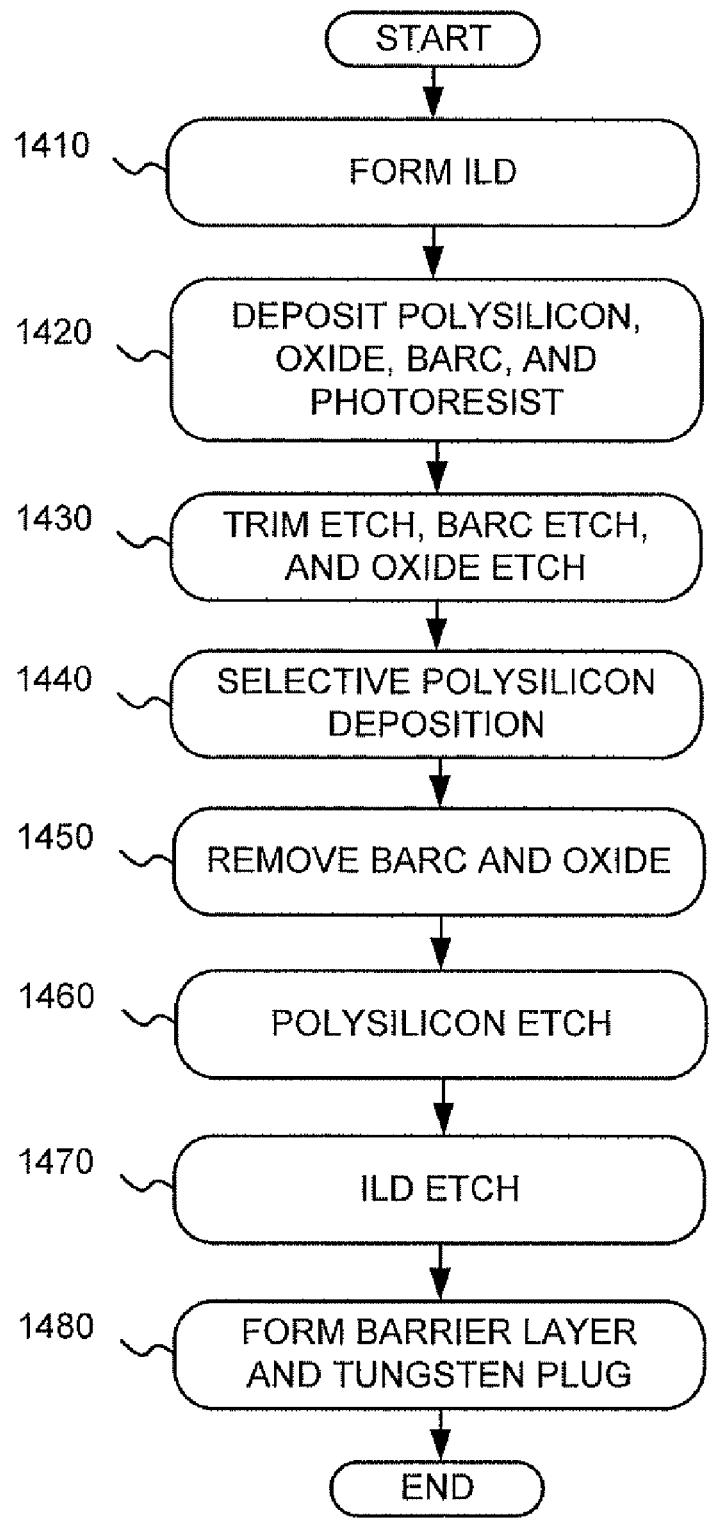
FIG. 14 illustrates an exemplary process for forming small contacts on a semiconductor device in yet another implementation consistent with the principles of the invention.

FIG. 14 illustrates an exemplary process for forming small contacts on a semiconductor device in yet another implementation consistent with the principles of the invention. FIGS. 15-19 illustrate exemplary cross-sectional views of a semiconductor device fabricated according to the processing described with regard to FIG. 14.

Figure 15:
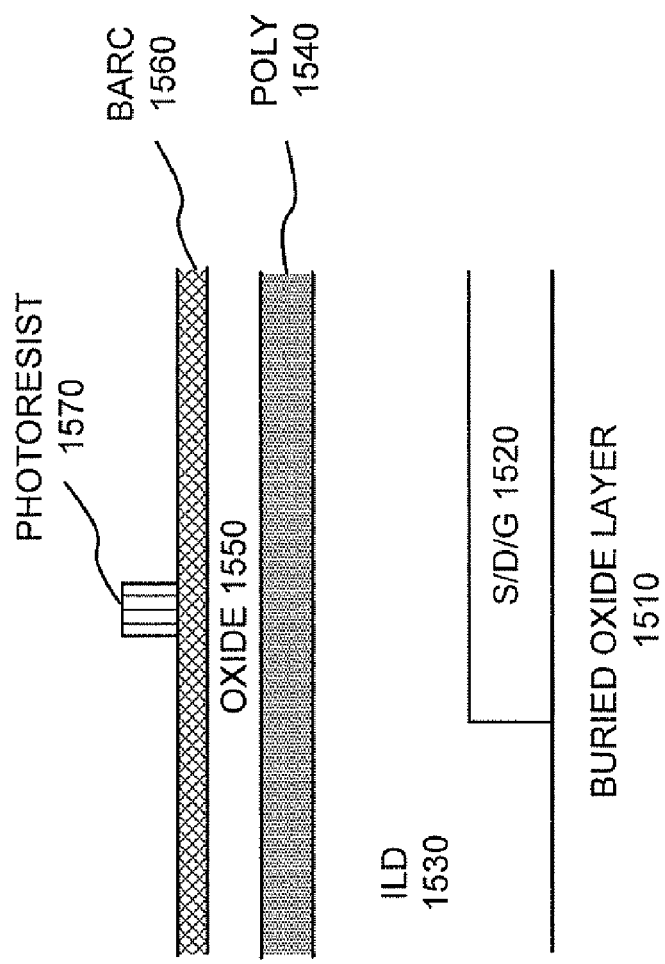
FIGS. 15-19 illustrate exemplary cross-sectional views of a semiconductor device fabricated according to the processing described with respect to FIG. 14.

With reference to FIGS. 14 and 15, processing may begin with semiconductor device 1500. Semiconductor device 1500 may include a buried oxide layer 1510 and a source, drain, and/or gate (S/D/G) 220 formed on buried oxide layer 1510. S/D/G 1520 may be formed on buried oxide layer 1510 using any conventional technique. While element 1520 is shown to be a source, drain, and/or gate, element 1520 may be any material (e.g., any active material) that is to be contacted.

As illustrated in FIG. 15, an ILD 1530 may be formed on semiconductor device 1500 (act 1410). An oxide (e.g., $SiO_2$) or a nitride (e.g., $Si_3N_4$), or another type of dielectric material, may be used as ILD 1530. The dielectric material may be deposited to a thickness of approximately 2000 Å to 4000 Å to cover S/D/G 1520, or at least the portion of S/D/G 1520 to be contacted. ILD 1530 may then be polished using, for example, a conventional polishing technique, such as CMP.

A thin layer of polysilicon material (poly) 1540 may then be deposited on ILD 1530 (act 1420), as illustrated in FIG. 15. Polysilicon material 1540 may include a polysilicon or an amorphous silicon material, or some other type of silicon-based material. Polysilicon material 1540 may be deposited to a thickness ranging from about 100 Å to 200 Å. An oxide layer 1550 may then be formed on polysilicon material 1540 using conventional techniques (act 1420), as illustrated in FIG. 15. Oxide layer 1550 may be formed to a thickness ranging from about 400 Å to 600 Å.

A BARC layer 1560 may be formed on oxide layer 1550 (act 1420), as illustrated in FIG. 15. For example, a silicon-rich nitride (SiRN) material, or another type of material (e.g., another type of nitride), may be deposited on oxide layer 1550 using a conventional technique, such as a spin-on or CVD technique. BARC layer 1560 may be formed to a thickness of approximately 200 Å to 350 Å on oxide layer 1550.

A photoresist 1570, or the like, may be deposited and patterned to facilitate formation of the contacts (act 1420), as shown in FIG. 15. Photoresist 1570 may include any conventional photoresist material and may be deposited on BARC 1560 to a thickness ranging from about 2000 Å to 4000 Å. The width of photoresist 1570, as shown in FIG. 15, may range from about 2000 Å to 2500 Å.

Figure 16:
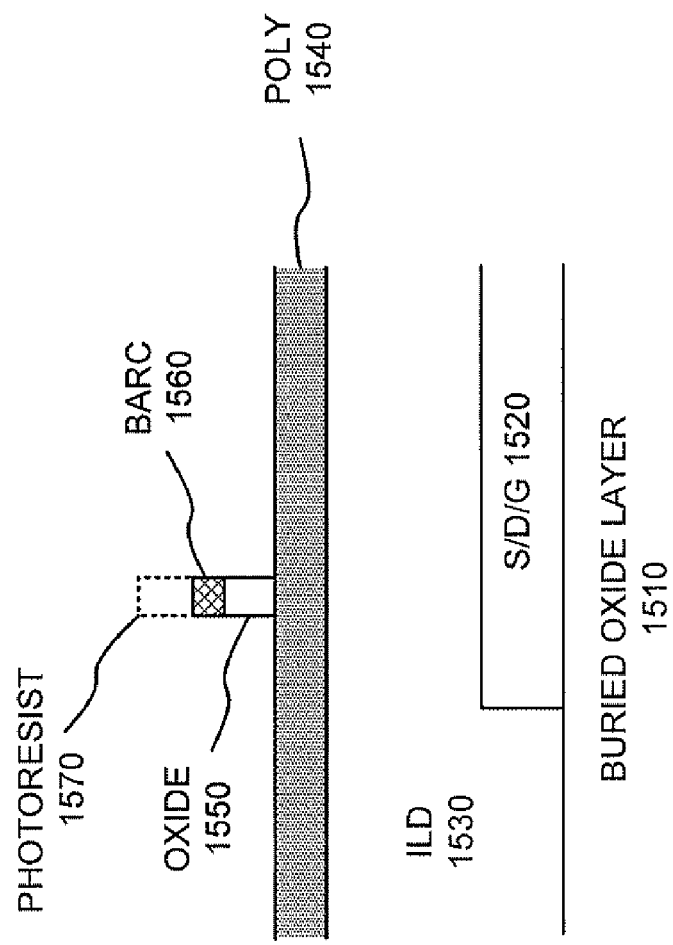

Photoresist 1570 may then be trim etched, using a conventional technique, to narrow the width of photoresist 1570 (act 1430), as illustrated in FIG. 16. The width of photoresist 1570 after the trim etch may range from about 1000 Å to 1400 Å.

As illustrated in FIG. 16, BARC 1560 and oxide 1550 may be etched using any conventional technique (act 1430). For example, BARC 1560 and oxide 1550 may be etched to remove BARC 1560 and oxide 1550 from over polysilicon 1540, except that portion of BARC 1560 and oxide 1550 under photoresist 1570, as illustrated in FIG. 16. The remaining width of BARC 1560 and oxide 1550 after the etching may range from about 1000 Å to 1400 Å. Photoresist 1570 may then be stripped using any conventional technique.

Figure 17:
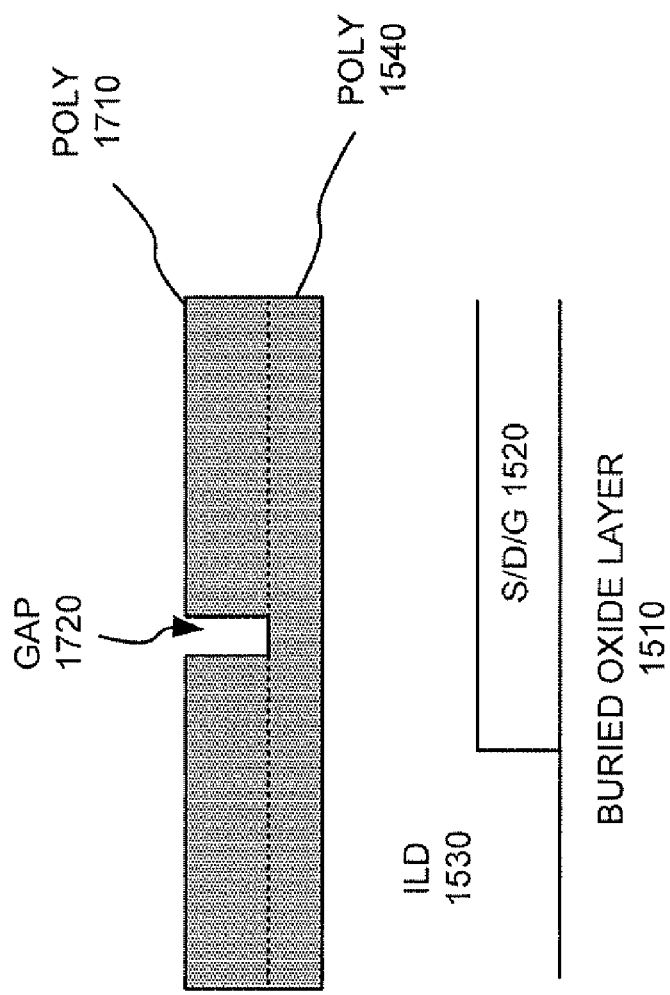

A selective polysilicon deposition may then be performed to deposit polysilicon material (poly) 1710 over polysilicon 1540 (act 1440), as illustrated in FIG. 17. Selective polysilicon deposition may be performed using typical chemistries, such as $SiH_2Cl_2$+HCl. Polysilicon 1710 may not deposit on nitride BARC 1560. Even if BARC 1560 is removed previously, polysilicon 1710 may not deposit on oxide 1550. The thin layer of polysilicon 1540 underneath may serve as a seed layer. Polysilicon 1710 may be formed to a thickness of about 400 Å to 600 Å. Once polysilicon 1710 has been deposited, BARC 1560 and oxide 1550 may be removed using a conventional technique (act 1450), as illustrated in FIG. 17. The removal of BARC 1560 and oxide 1550 forms a gap 1720 that exposes a portion of polysilicon 1540.

Figure 18:
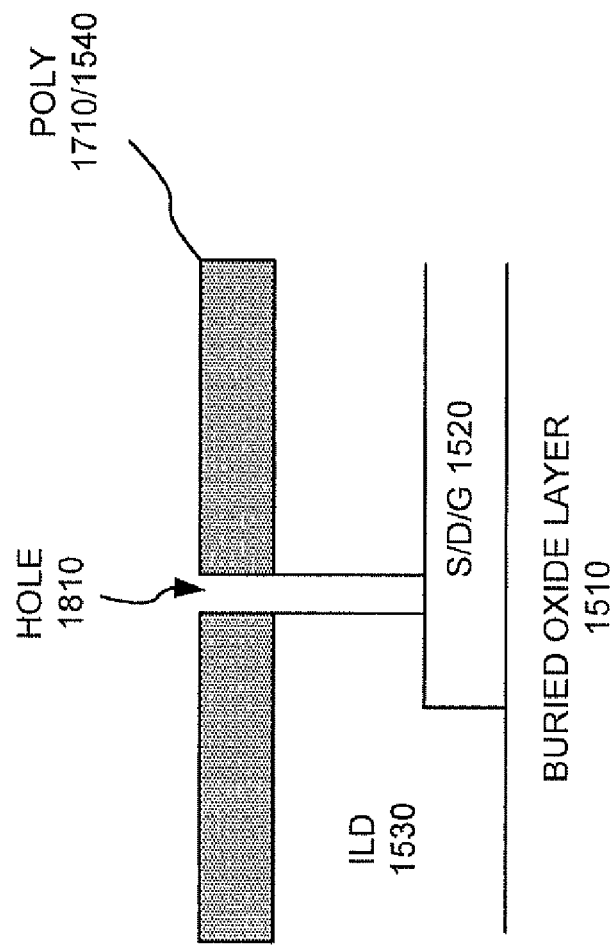

Polysilicon 1710/1540 may then be etched using a plasma etch technique to remove the portion of polysilicon 1540 from gap 1720 (act 1460), as illustrated in FIG. 18. This etching may also cause the removal of some of polysilicon 1710. ILD 1530 may then be etched using polysilicon 1710/1540 as a mask (act 1470). As illustrated in FIG. 18, the etching of ILD 1530 may form a contact hole 1810 that extends to S/D/G 1520. The width of contact hole 1810, as illustrated in FIG. 18, may range from about 1000 Å to 1400 Å.

Figure 19:
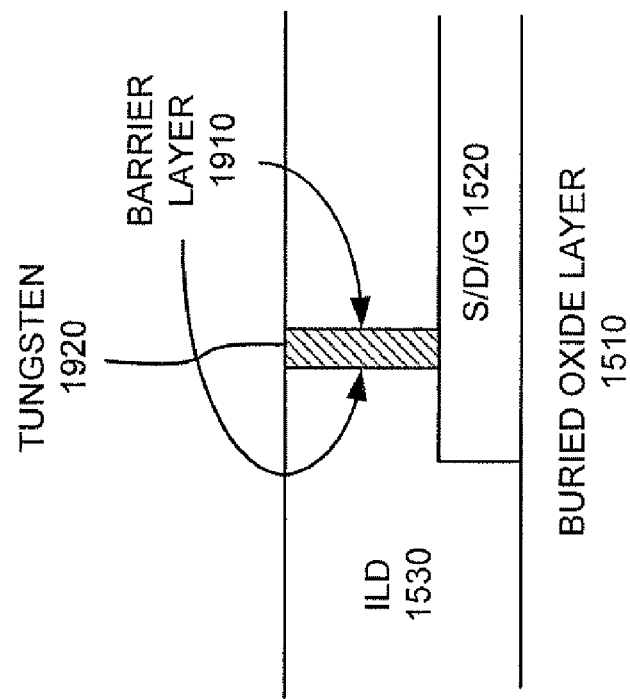

As illustrated in FIG. 19, a barrier layer 1910 may then be formed on side surfaces of hole 1810 (act 1480). A metal (e.g., titanium nitride), or another type of conductive material (e.g., tantalum nitride), may be used as barrier layer 1910. Barrier layer 1910 may be deposited or otherwise formed on the side surfaces of hole 1810 to a thickness ranging from about 100 Å to 200 Å.

As illustrated in FIG. 19, a tungsten plug 1920 may then be formed within hole 1810 (act 1480). For example, a tungsten material, or another suitable contact material, such as copper or aluminum, may be deposited to fill hole 1810. A polishing process, such as CMP, may then be performed to planarize semiconductor device 1500. For example, the polishing process may serve to remove any remaining polysilicon 1710/1540 from over ILD 1530.

The resulting semiconductor device 1500 may include one or more small contacts (e.g., contacts having a size smaller than about 100-140 nm). While the above description details a process for forming a single contact, one skilled in the art would recognize that the process can be extended to form more than one contact to any material to be contacted.

Figure 20:
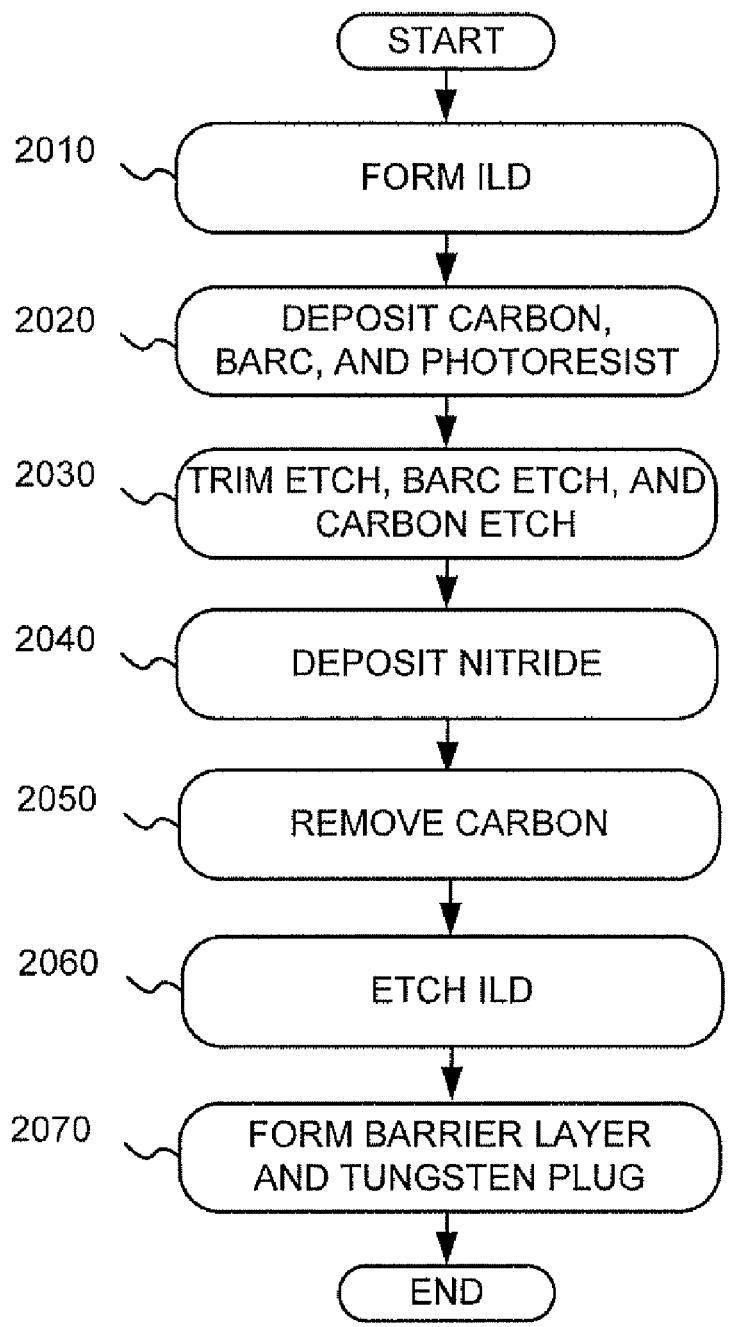
FIG. 20 illustrates an exemplary process for forming small contacts on a semiconductor device in a further implementation consistent with the principles of the invention.

FIG. 20 illustrates an exemplary process for forming small contacts on a semiconductor device in a further implementation consistent with the principles of the invention. FIGS. 21-25 illustrate exemplary cross-sectional views of a semiconductor device fabricated according to the processing described with regard to FIG. 20.

Figure 21:
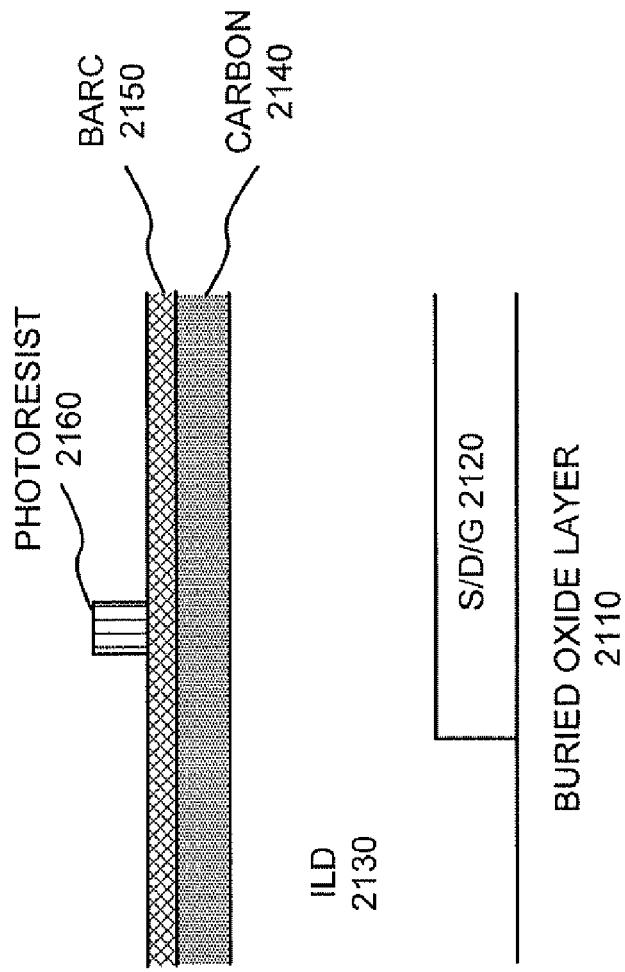
FIGS. 21-25 illustrate exemplary cross-sectional views of a semiconductor device fabricated according to the processing described with respect to FIG. 20.

With reference to FIGS. 20 and 21, processing may begin with semiconductor device 2100. Semiconductor device 2100 may include a buried oxide layer 2110 and a source, drain, and/or gate (S/D/G) 2120 formed on buried oxide layer 2110. S/D/G 2120 may be formed on buried oxide layer 2110 using any conventional technique. While element 2120 is shown to be a source, drain, and/or gate, element 2120 may be any material (e.g., any active material) that is to be contacted.

As illustrated in FIG. 21, an interlayer (or interlevel) dielectric (ILD) 2130 may be formed on semiconductor device 2100 (act 2010). An oxide (e.g., $SiO_2$) or a nitride (e.g., $Si_3N_4$), or another type of dielectric material, may be used as ILD 2130. The dielectric material may be deposited to a thickness of approximately 2000 Å to 4000 Å to cover S/D/G 2120, or at least the portion of S/D/G 2120 to be contacted. ILD 2130 may then be polished using, for example, a conventional polishing technique, such as chemical-mechanical polishing (CMP).

A carbon material 2140 may then be deposited on ILD 2130 (act 2020), as illustrated in FIG. 21. Carbon material 2140 may be deposited to a thickness ranging from about 600 Å to 1000 Å.

A BARC layer 2150 may be formed on carbon layer 2140 (act 2020), as illustrated in FIG. 21. For example, a silicon-rich nitride (SiRN) material, or another type of material (e.g., another type of nitride), may be deposited on carbon 2140 using a conventional technique, such as a spin-on or CVD technique. BARC layer 2150 may be formed to a thickness of approximately 200 Å to 350 Å on carbon 2140.

A photoresist 2160, or the like, may be deposited and patterned to facilitate formation of the contacts (act 2020), as shown in FIG. 21. Photoresist 2160 may include any conventional photoresist material and may be deposited on BARC 2150 to a thickness ranging from about 2000 Å to 4000 Å. The width of photoresist 2160, as shown in FIG. 21, may range from about 2000 Å to 2500 Å.

Figure 22:
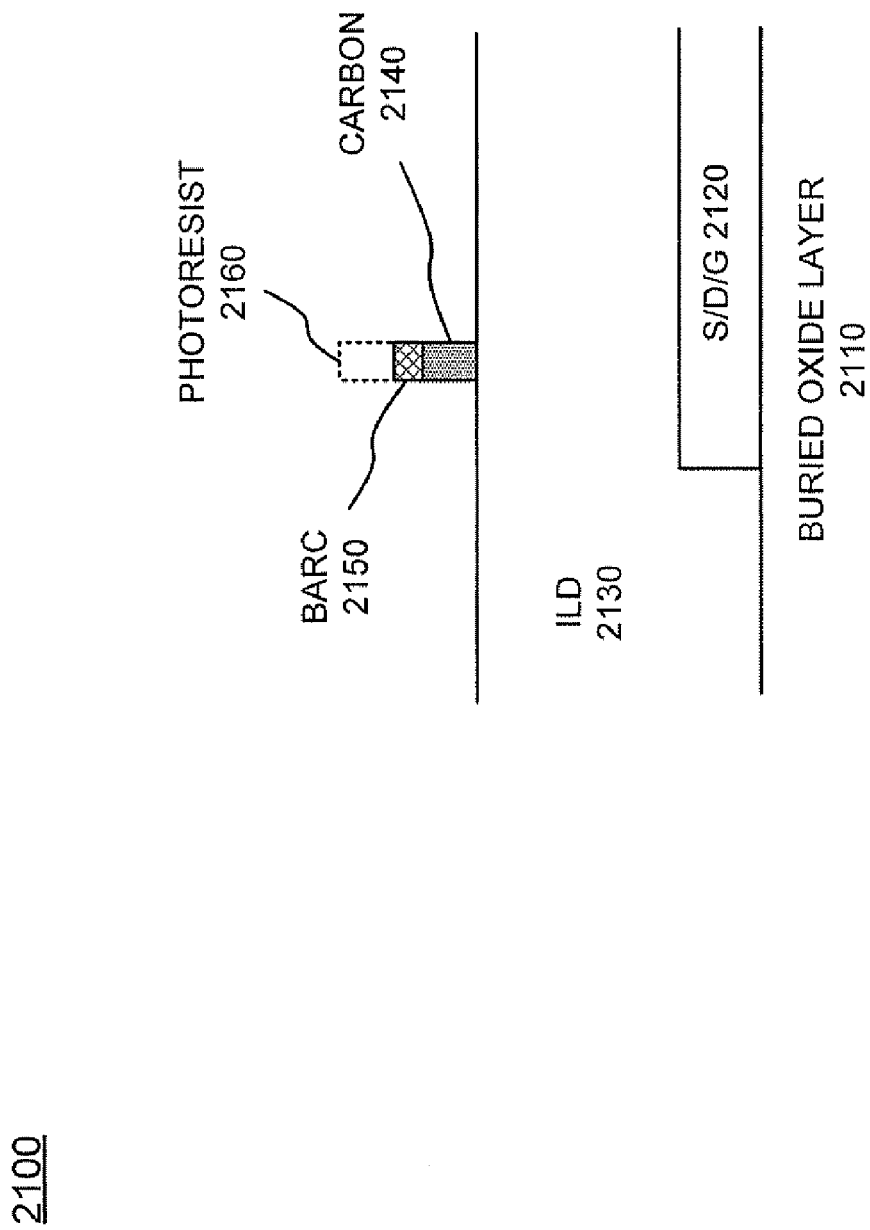

Photoresist 2160 may then be trim etched, using a conventional technique, to narrow the width of photoresist 2160 (act 2030), as illustrated in FIG. 22. The width of photoresist 2160 after the trim etch may range from about 1000 Å to 1400 Å.

As illustrated in FIG. 22, BARC 2150 and carbon 2140 may be etched using any conventional technique (act 2030). For example, BARC 2150 and carbon 2140 may be etched to remove BARC 2150 and carbon 2140 from over ILD 2130, except that portion of BARC 2150 and carbon 2140 under photoresist 2160, as illustrated in FIG. 22. The remaining width of BARC 2150 and carbon 2140 after the etching may range from about 1000 Å to 1400 Å. Photoresist 2160 may then be stripped using any conventional technique.

Figure 23:
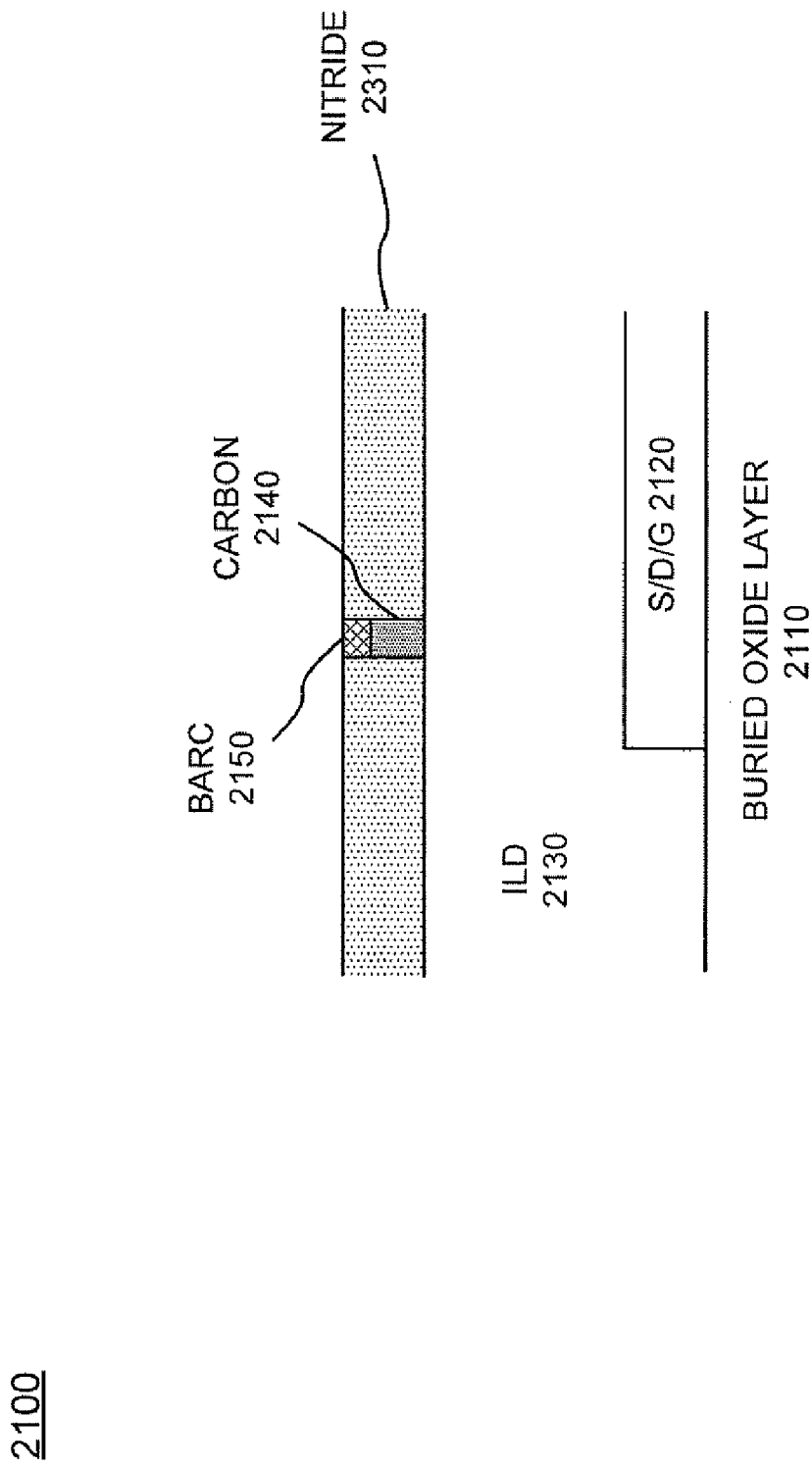

As illustrated in FIG. 23, a nitride material 2310 may be deposited over ILD 2140 (act 2040). Nitride material 2310 may be deposited to a thickness ranging from approximately 800 Å to 1200 Å. Nitride material 2310 may then be polished, using, for example, CMP, to planarize nitride material 2310 at a level approximately equal to the top of BARC 2150. BARC 2150 may be consumed during the nitride polish to expose carbon 2140 in the hole. According to another implementation, BARC 2150 may be stripped before nitride material 2310 is deposited over carbon 2140. According to yet another implementation, BARC 2150 may be removed after the nitride polish. In any event, carbon 2140 may be removed after the nitride polish using conventional etching techniques (act 2050).

Figure 24:
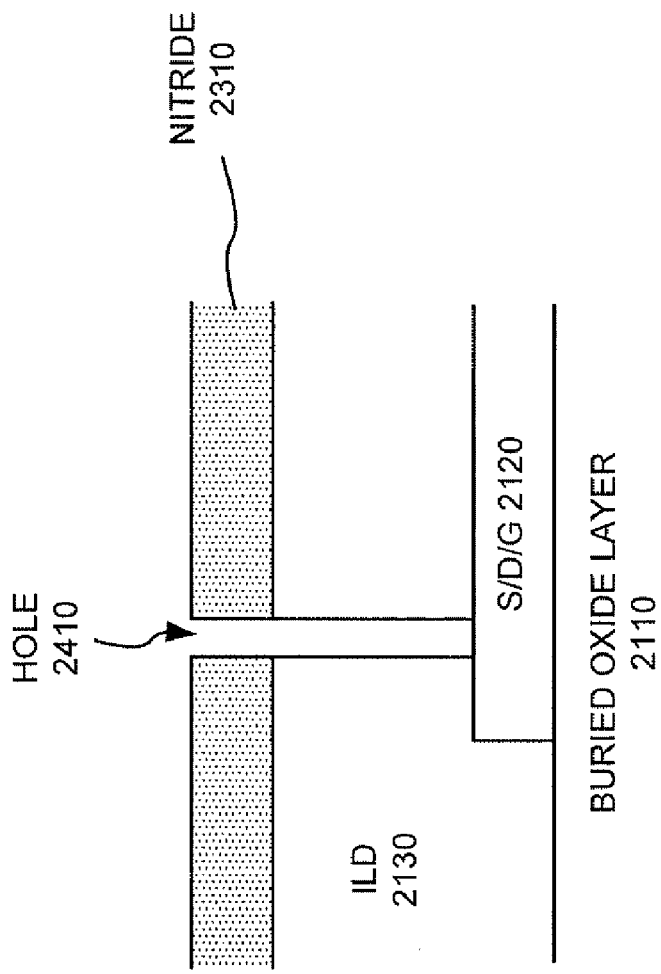

ILD 2130 may then be etched using nitride 2310 as a mask (act 2060). As illustrated in FIG. 24, the etching of ILD 2130 may form a contact hole 2410 that extends to S/D/G 2120. The width of contact hole 2410, as illustrated in FIG. 24, may range from about 1000 Å to 1400 Å.

Figure 25:
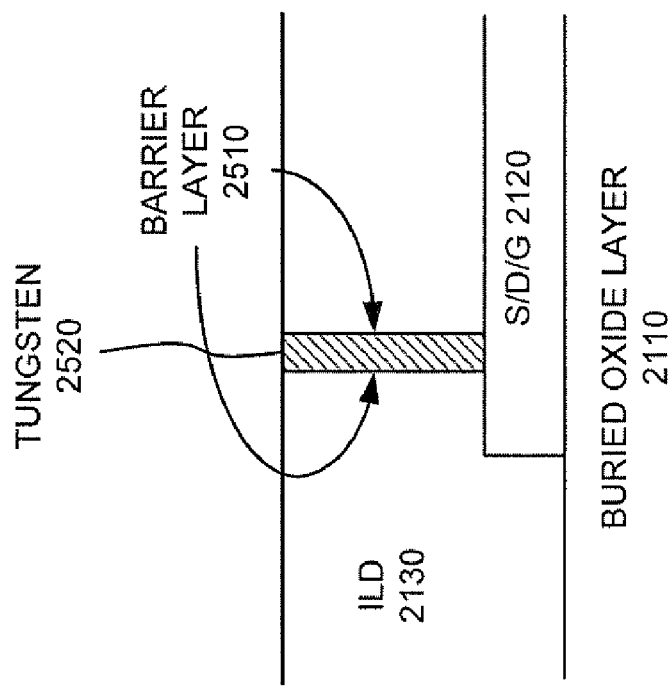

As illustrated in FIG. 25, a barrier layer 2510 may then be formed on side surfaces of hole 2410 (act 2070). A metal (e.g., titanium nitride), or another type of conductive material (e.g., tantalum nitride), may be used as barrier layer 2510. Barrier layer 2510 may be deposited or otherwise formed on the side surfaces of hole 2410 to a thickness ranging from about 100 Å to 200 Å.

As illustrated in FIG. 25, a tungsten plug 2520 may then be formed within hole 2410 (act 2070). For example, a tungsten material, or another suitable contact material, such as copper or aluminum, may be deposited to fill hole 2410. A polishing process, such as CMP, may then be performed to planarize semiconductor device 2100. For example, the polishing process may serve to remove any remaining nitride material 2310 from over ILD 2130.

The resulting semiconductor device 2100 may include one or more small contacts (e.g., contacts having a size smaller than about 100-140 nm). While the above description details a process for forming a single contact, one skilled in the art would recognize that the process can be extended to form more than one contact to any material to be contacted.

OTHER IMPLEMENTATIONS

Figure 26:
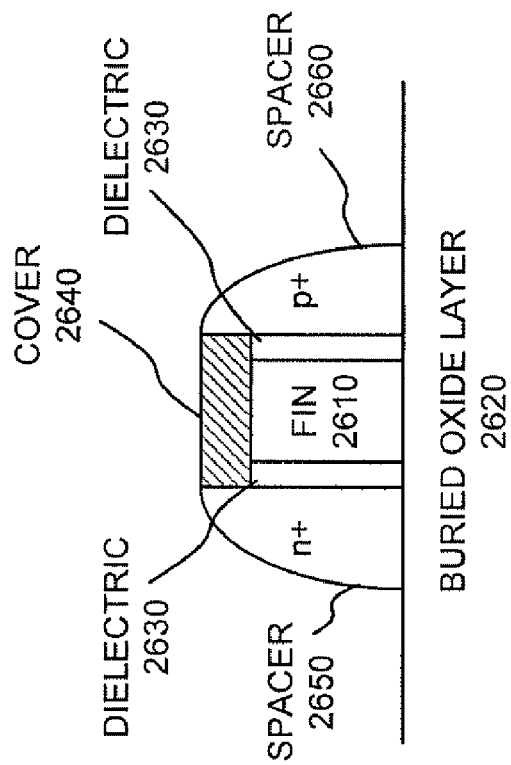
FIGS. 26-28 illustrate an exemplary process for forming a double gate MOSFET with asymmetric polysilicon gates.
Figure 27:
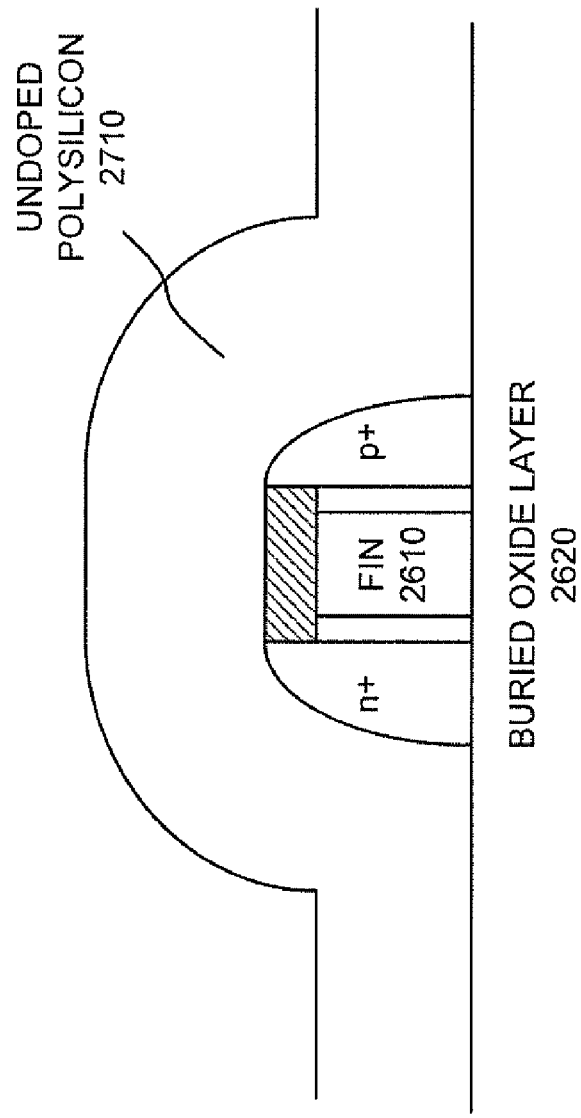
Figure 28:
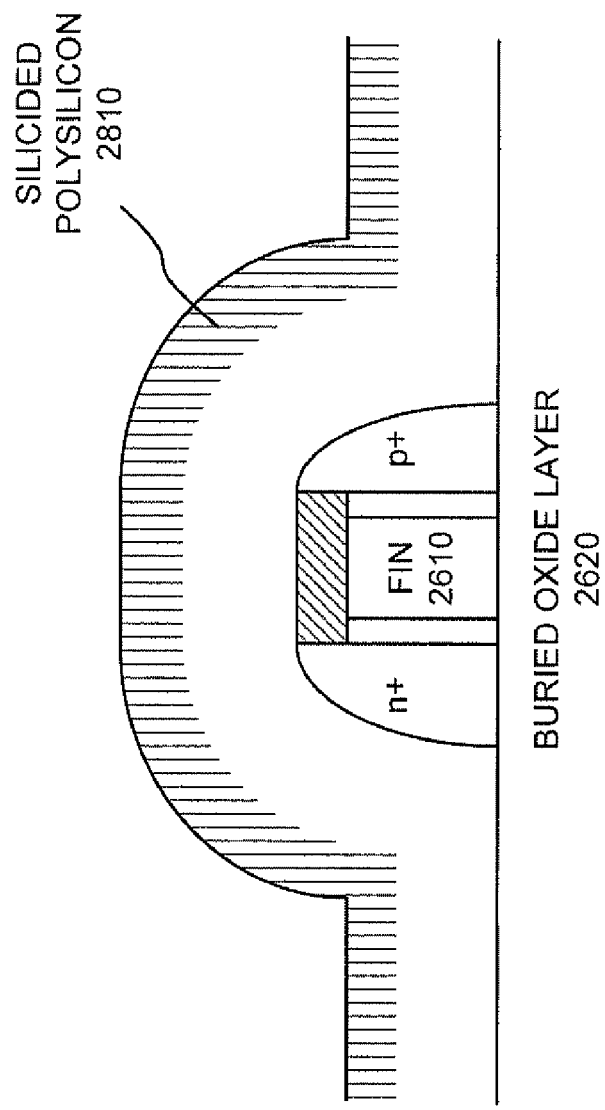

A double gate MOSFET with asymmetric polysilicon gates is described with regard FIGS. 26-28. FIGS. 26-28 illustrate an exemplary process for forming a double gate MOSFET with asymmetric polysilicon gates. As shown in FIG. 26, a semiconductor device 2600 may include a fin 2610 formed on a buried oxide layer 2620. Fin 2610 may be formed using one or more conventional etching techniques. A gate dielectric material 2630 may be formed or grown on side surfaces of fin 2610. A protective cover 2640 may be formed over fin 2610 and gate dielectric 2630. Cover 2640 may include a silicon nitride or another suitable material.

A gate electrode material may then be deposited over semiconductor device 2600 and etched to form spacers 2650 and 2660 adjacent gate dielectric material 2630 on side surfaces of fin 2610, as illustrated in FIG. 26. Spacers 2650 and 2660 may then be doped using a tilt angle implant process. For example, n-type impurities, such as arsenic or phosphorous, may be implanted such that only a small percentage of the n-type impurities, if any, will reach spacer 2660 as the majority of spacer 2660 will be shielded from the implantation by fin 2610 and cover 2640. Next, p-type impurities, such as, for example, boron or $BF_2$, may be implanted such that only a small percentage of the p-type impurities, if any, reach spacer 2650, as the majority of spacer 2650 will be shielded from the implantation by fin 2610 and cap 2640. After the tilt angle implant processes are complete, spacer 2650 includes silicon doped predominately with, or only with, n-type impurities and spacer 2660 includes silicon doped predominately with, or only with, p-type impurities.

An undoped polysilicon layer 2710 may be deposited over semiconductor 2600, as illustrated in FIG. 27. Polysilicon layer 2710 may then be silicided by depositing a metal, followed by an annealing to form a layer of silicided polysilicon material 2810, as illustrated in FIG. 28. The resulting semiconductor device is a double gate MOSFET with asymmetrical polysilicon gates.

Figure 29:
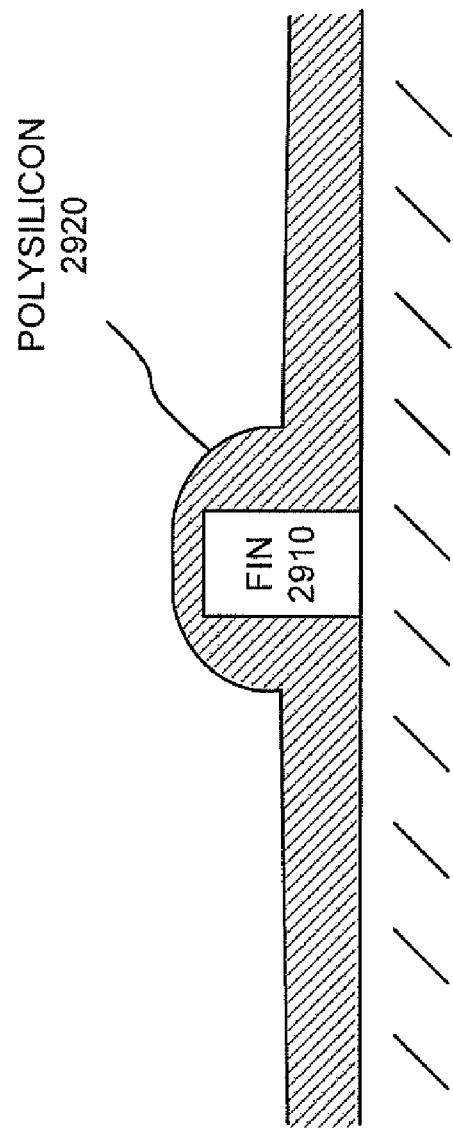
FIGS. 29-31 illustrate an exemplary process for using a silicon rich nitride (SRN) polish to planarize the surface of a semiconductor device to facilitate fin gate patterning.
Figure 30:
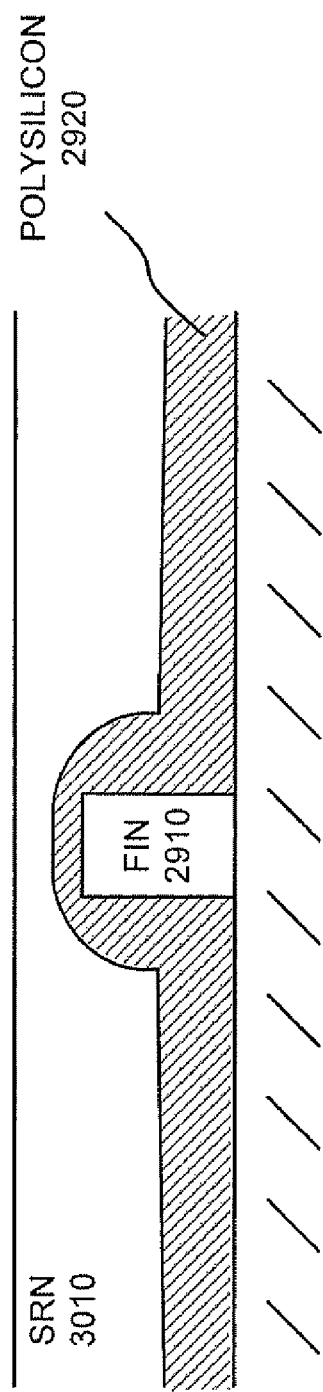
Figure 31:
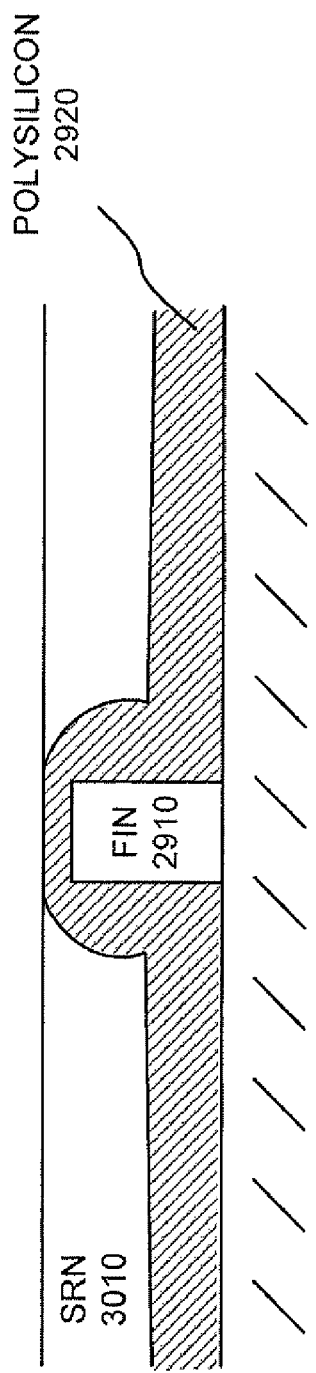

There is also a need in the art to improve step coverage during fin gate patterning. FIGS. 29-31 illustrate an exemplary process for using a silicon rich nitride (SRN) to planarize the surface and facilitate gate patterning. As illustrated in FIG. 29, a semiconductor device 2900 may include a fin 2910 formed on a substrate. A polysilicon material 2920 may be deposited over the substrate to cover fin 2910.

A SRN material 3010 may be deposited over the substrate to cover polysilicon material 2920 and fin 2910, as illustrated in FIG. 30. SRN material 3010 may then be polished using a conventional polishing technique (e.g., CMP) to planarize the surface to facilitate subsequent gate patterning associated with polysilicon 2920, as illustrated in FIG. 31.

CONCLUSION

Implementations consistent with the principles of the invention provide methods for forming small contacts (e.g., contacts less than approximately 100-140 nm) using, for example, an image reversal technique. Such small contacts permit the size of semiconductor devices, such as flash memory devices, SRAM devices, and transistors, to be reduced.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 1, 7, 14, and 20, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method for forming a contact for a semiconductor device, comprising:
   depositing a carbon material over the semiconductor device;
   depositing an anti-reflective coating over the carbon material;
   etching the carbon material to leave a portion of the carbon material;
   depositing a nitride material;
   planarizing the nitride material, where the planarized nitride material is at a level approximately equal to the top of the anti-reflective material;
   forming a contact hole by removing the portion of the carbon material; and
   filling the contact hole to form the contact for the semiconductor device.

2. The method of claim 1, further comprising:
   forming an interlayer dielectric over the semiconductor device; and
   where the depositing a carbon material includes:
      depositing the carbon material over the interlayer dielectric.

3. The method of claim 2, where the forming a contact hole further includes:
   etching the interlayer dielectric using the nitride material as a mask to form the contact hole that extends through the interlayer dielectric.

4. The method of claim 2, further comprising:
   forming an antireflective coating on the carbon material; and
   forming and patterning a photoresist on the antireflective coating; and
   where the etching the carbon material includes:
      etching the carbon material and the antireflective coating based on the photoresist.

5. The method of claim 4, further comprising:
   stripping the photoresist after etching the carbon material and the antireflective coating.

6. The method of claim 2, where the filling the contact hole includes:
   forming a barrier layer on side surfaces of the contact hole, and
   depositing a conductive material to at least partially fill the contact hole.

7. The method of claim 2, further comprising:
   polishing the semiconductor device to remove the nitride material after forming the contact hole.

8. The method of claim 1, where depositing the carbon material comprises:

depositing the carbon material at a thickness ranging from approximately 600 Å to 1000 Å.

9. The method of claim 1, where forming the contact hole includes:

removing the anti-reflective coating.

10. The method of claim 1, where the contact hole has a width ranging from approximately 1000 Å to 1400 Å.

* * * * *